United States Patent [19]

Majima

[11] Patent Number: 4,579,624

[45] Date of Patent: Apr. 1, 1986

[54] PROCESS FOR MANUFACTURING A MAGNETIC BUBBLE MEMORY CHIP

[75] Inventor: Teiji Majima, Hatano, Japan

[73] Assignee: Fujitsu Limited, Kawasaki, Japan

[21] Appl. No.: 706,612

[22] Filed: Feb. 28, 1985

[30] Foreign Application Priority Data

Mar. 3, 1984 [JP] Japan .................................. 59-39741

[51] Int. Cl.[4] .......................... B44C 1/22; B29C 17/08; B05D 5/12; G11C 19/08
[52] U.S. Cl. .................................... 156/643; 156/646; 156/653; 156/655; 156/657; 156/659.1; 156/668; 204/192 E; 365/15; 427/130; 427/131
[58] Field of Search ............... 156/643, 646, 653, 655, 156/657, 659.1, 668; 204/192 EC, 192 E; 427/130, 131, 132; 365/15; 430/317

[56] References Cited

PUBLICATIONS

IEEE Transactions on Magnetics, vol. MAG-20, No. 5, Sep. 1984, Design and Fabrication of a 4 Mbit Bubble Memory Chip with 4 μm Period Permalloy, Propagation Tracks, T. Majima et al., pp. 1066–1071.

Primary Examiner—William A. Powell
Attorney, Agent, or Firm—Staas & Halsey

[57] ABSTRACT

A process for manufacturing a dual spacing type magnetic bubble memory chip having a thin garnet film, on which a first area is provided with minor loop transmission lines for memorizing bubble information and a second area is provided with major transmission lines for recording or reading out the bubble information. The process comprises forming a first insulative layer ($SiO_2$) on the garnet film over the first and second areas, forming conductive patterns on the $SiO_2$ layer, coating the $SiO_2$ layer and conductive patterns with a second insulative layer of resin (PLOS) and thermosetting the coated insulative layer, removing by etching part of the $SiO_2$ and PLOS layers, which exist on the first area, forming a third insulative layer ($SiO_2$) over the whole surface including the first and second areas, and forming the minor loop transmission lines and the major transmission lines on the third insulative layer.

7 Claims, 13 Drawing Figures

PROCESS FOR MANUFACTURING A MAGNETIC BUBBLE MEMORY CHIP

BACKGROUND OF THE INVENTION

The present invention relates to a process for manufacturing a magnetic bubble memory chip, and more particularly, to a process for manufacturing a dual spacing type magnetic bubble memory chip having a thin bubble film, on which a first area is provided with minor loop transmission lines for memorizing bubble information and a second area is provided with major transmission lines for recording or reading out the bubble information with respect to the minor loop transmission lines.

Recent developments in the design of magnetic bubble memory chips has led to a demand that the bubble information accommodating sections of these chips, comprising the minor loop transmission lines, be made more and more compact to enable a higher density installation of these devices. For instance, in a 4 megabit chip the pattern periods should be 4 $\mu$m. On the other hand, in the function sections, such as swap gates, replicate gates, and generators, and major transmission lines (major lines) for recording or reading out the bubble information accommodated in the minor loop transmission line organization, relatively large patterns, such as 16 $\mu$m periods, are used to enable a higher degree of positioning accuracy during the manufacturing process of the bubble memory chip. However, where different size transmission patterns are used in a single memory chip, as mentioned above, it has been found that problems concerning the characteristics will occur due to differences in the driving forces.

FIG. 1 illustrates a cross-section of a magnetic bubble memory chip having a dual spacing layer structure manufactured in accordance with a prior art technique, and FIG. 2 illustrates an enlarged cross-section of the bubble memory chip of FIG. 1 during the manufacturing process. According to the known art, a layer of $SiO_2$ 2 is formed on a garnet film 1 by sputtering and gold (Au) conductive patterns 3 for controlling function gates are formed thereon. In order to level the steps of the conductive pattern 3, a high temperature tolerant resin 4, such as polyladder-organosiloxane (PLOS), is coated thereon and thermoset, and then only the PLOS layer 4 in an area 5 of the chip corresponding to the small-sized transmission patterns for the information accommodating section is etched, with a plasma etching agent including $CF_4$ etchant gas. The permalloy patterns 6 for the transmission patterns are formed thereafter.

The above-mentioned prior art method has several problems. A first is the unevenness of the rate of etching in each batch when manufacturing the magnetic bubble memory chips. Conventionally, a planner plate type etching machine is generally used for etching such a high temperature tolerant resin 4, and although this type of etching machine is superior to a cylindrical type etching machine in etching evenness, usually there is still a variation in the rate of etching of within ±5% per batch. For instance, if the film thickness of the high temperature tolerant resin layer 4 is 3800 Å and the thickness is to be reduced by etching by 3000 Å, to obtain a spacer having a thickness of 1300 Å including the $SiO_2$ layer 2 of 500 Å, a variation of etching within ±150 Å will occur per batch when the thickness of the high temperature tolerant resin is reduced by 3000 Å. In addition, when variation between the batches are taken into account, there may be a variation of at least ±300 Å. Such a large variation of ±300 Å will cause a serious problem, i.e., degradation of performance of the bubble memory chip, since 1300 Å is the most favorable thickness for a spacer, as will be described hereinafter.

A second problem is that when an uneven face 7 having a thickness of 200 Å to 300 Å is formed on the etched surface, as seen from FIG. 2, the permalloy film formed thereon may have a local high spot Hc, which will affect the characteristics of the bubble memory.

SUMMARY OF THE INVENTION

It is an object of the present invention to provide a process for manufacturing a magnetic bubble memory chip, which process eliminates the disadvantages as discussed above with reference to the known conventional manufacturing process.

It is another object of the present invention to provide a process for manufacturing a magnetic bubble memory chip, wherein there is less variation in the thickness among the spacers and the surfaces thereof are smooth, thus, attaining stable characteristics.

According to the present invention, there is provided a process for manufacturing a magnetic bubble memory chip having a thin bubble film, on which a first area is provided with minor loop transmission lines for memorizing bubble information and a second area is provided with major transmission lines for recording or reading out the bubble information with respect to the minor loop transmission lines. This process comprises the steps of: (1) forming a first insulative layer on the thin bubble film over the first and second areas; (2) forming conductive patterns on the first insulative layer for controlling the function gates; (3) coating a second insulative layer of resin over the first insulative layer and conductive patterns for controlling function gates, and thermosetting the coated second insulative resin layer, (4) removing by etching the part of the first insulative layer and the second insulative resin layer on the first area; (5) forming a third insulative layer over the whole surface including the first and second areas; and (6) forming minor loop transmission lines and major transmission lines on the third insulative layer.

DESCRIPTION OF THE PREFERRED EMBODIMENT

Figure 1:
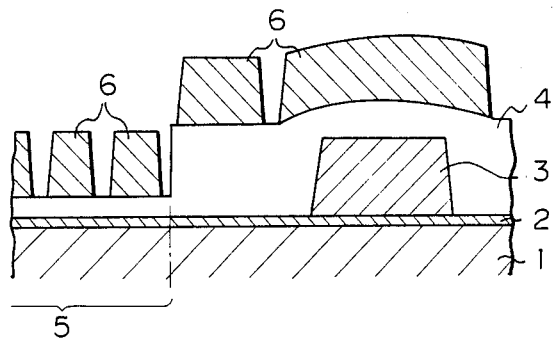
FIG. 1 is a cross-sectional view of a magnetic bubble memory chip manufactured in accordance with a known conventional process.
Figure 2:
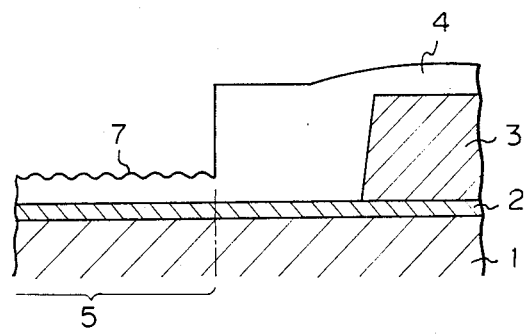
FIG. 2 is a cross-sectional view of one of the steps of the known conventional process of manufacturing the bubble memory chip.
Figure 3:
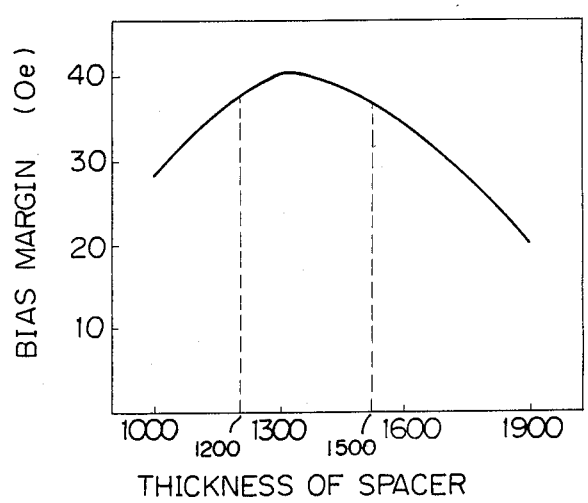
FIG. 3 is a diagram illustrating the relationship between the thickness of the spacer of a magnetic bubble memory chip and the characteristics thereof, i.e., the bias margin.

FIG. 3 shows the relationship between the thickness of the spacer and the bubble propagation performance when using a soft magnetic pattern having 4 μm pattern periods. As can be seen the figure, a thickness of 1300 Å ensures the most favorable relationship.

FIGS. 4A to 4F sequentially illustrate the respective steps in a process of manufacturing a magnetic bubble memory chip according to the present invention. In FIGS. 4A to 4F, reference numeral 10 denotes a thin garnet film of a magnetic bubble; 11, a first insulative layer; 12, a conductive pattern for controlling function gates; 13, a second insulative layer; 14, a first area; 15, a second area; 16, a photoresist layer; 17, a third insulative layer; and 18 and 18′, soft magnetic patterns for bubble transmission.

An embodiment of a process for manufacturing a magnetic bubble memory chip according to the present invention will now be described with reference to FIGS. 4A to 4F.

Figure 4A:
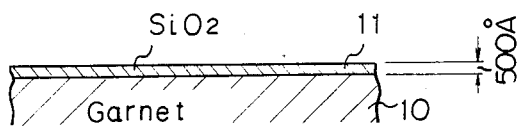
FIGS. 4A to 4F are a series of cross-sectional views of a process for manufacturing a magnetic bubble memory chip according to the present invention.

In a first step, as shown in FIG. 4A, a first insulative layer 11 is formed by sputtering $SiO_2$ to a 500 Å thickness on a magnetic bubble thin film 10 formed on a substrate.

Figure 4B:
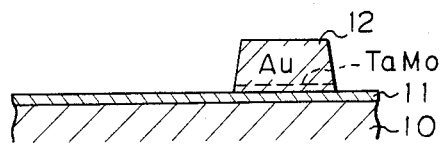

In a second step, as shown in FIG. 4B, a function gate controlling conductor consisting of Au, at a thickness about 3500 Å, is formed on the first insulative layer 11 by vapor deposition, and then a function gate controlling conductive pattern 12 is formed by sputtering with a photolithographic method. In this case, TaMo having a thickness 100 Å to 150 Å also can be used to improve the adhesiveness of the Au conductor 12 to the $SiO_2$ insulative layer 11.

Figure 4C:
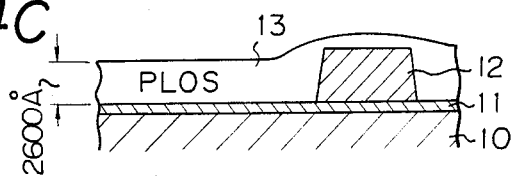

In a third step, as shown in FIG. 4C, a polyladder-organosiloxane resin (PLOS) having a thickness of 2600 Å, is coated over the whole surface and thermoset to form a second insulative layer 13.

Figure 4D:
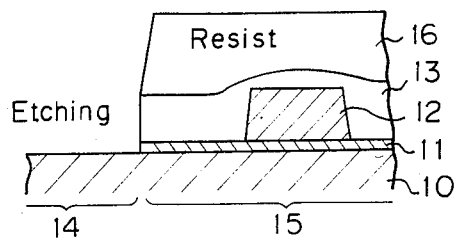

In fourth step, as shown in FIG. 4D, the second area 15 of this chip is covered with a resist 16. On the other hand, in the first area 14 of this chip which will serve as an information accommodating section, the first and second insulative layers 11 and 13 comprising $SiO_2$ and PLOS resin, respectively, are plasma etched with an etching agent including $CF_4$ etchant gas in a planner plate type dry etching machine, to expose the surface of the thin film 10 in the first area 14 of the magnetic bubble memory chip. In this case, both the first and second insulative layers of $SiO_2$ and PLOS resin can be etched with the same etchant, since a main component of PLOS is Si.

Figure 4E:
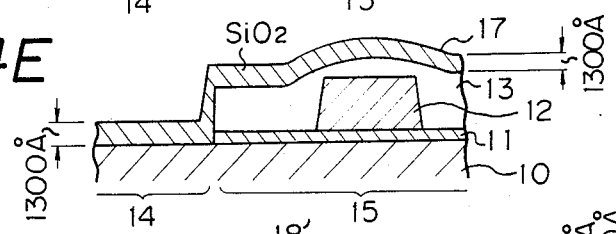

In a fifth step, as shown in FIG. 4E, a third insulative layer 17 of $SiO_2$, having a thickness of 1300 Å, is formed by sputtering over the first 14 and second 15 areas. As seen from FIG. 3, the thickness of the insulative layer 17 is favorably 1200 Å to 1500 Å, most preferably 1300 Å.

Figure 4F:
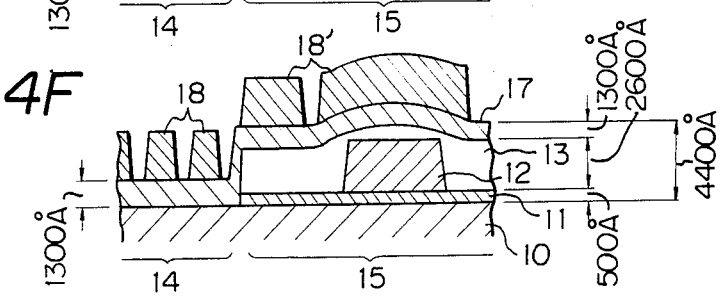

At the sixth and final step, as shown in FIG. 4F, after a soft magnetic material, such as permalloy, is formed by vapor deposition on the third insulative layer 17, soft magnetic patterns 18 and 18′ for bubble transmission, having different pattern periods, are formed thereon by photolithography or ion-etching. In this case, the soft magnetic pattern 18 constitutes transmission lines in the minor-loop organization in the first area 14 and the pattern period thereof is, for example, 4 μm to 6 μm. On the other hand, the soft magnetic pattern 18′ constitutes major transmission lines and a pattern for connecting the major transmission lines to the minor-loop organization, and the pattern period thereof is, for example, 8 μm to 16 μm.

According to the illustrated embodiment, since the magnetic bubble thin film 10 is not etched at all with the plasma etching agent using $CF_4$, a slight overetching is effective to prevent any nonuniformity of the etching and variations of the etched layer thickness. Therefore, magnetic bubble memory chips having a stable propagation performance can be obtained.

Figure 5:
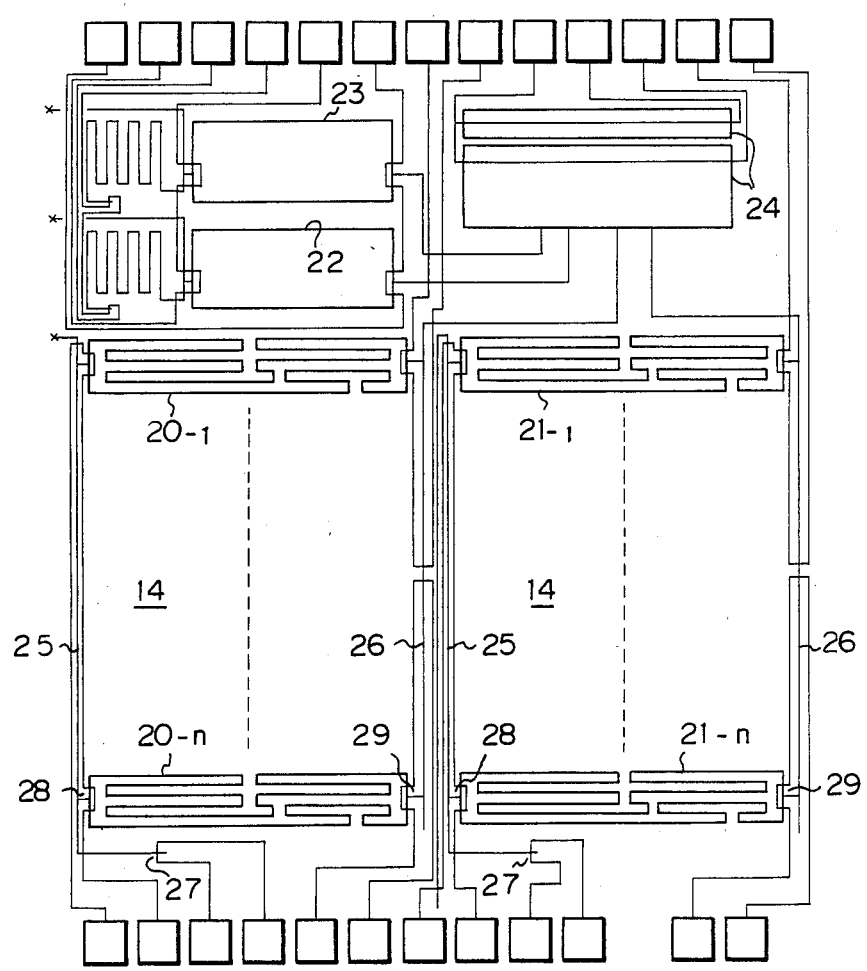
FIG. 5 is a plan view of an embodiment of a magnetic bubble memory chip manufactured in accordance with the present invention.

FIG. 5 is a plan view of an embodiment of a magnetic bubble memory chip manufactured in accordance with the present invention. In FIG. 5, reference numerals 20-1 to 20-n and 21-1 to 21-n denote minor-loops organization; 22 and 23, boot loops for memorizing information concerning faulty loops in the minor-loop organization; 24, detectors; 25, recording major lines; 26, read out major lines; 27, generators; 28, swap-gates; and 29, replicate-gates.

The embodiment shown in FIG. 5 is an odd-and-even number type major-minor organization, in which the first area comprises the minor-loop organization 20-1 to 20-n and 21-1 to 21-n, which serve as an information accommodating section, and the boot loops 22 and 23. The first area 14 uses small soft magnetic patterns 18 (FIG. 4F) having 4 μm periods and the thickness of the spacer thereof is 1300 Å, as seen from FIG. 4F.

The area other than the first area 14 is the second area, comprising, for instance, the generators 27, the recording major lines 25, the read out major lines 26, the swap-gates 28, the replicate gates 29, the detectors 24, and some small portions of the minor loop organization adjacent to the gates. The second area is constituted by soft magnetic patterns of 8 μm to 16 μm periods and the thickness of the spacer thereof is 4400 Å, as seen from FIG. 4F.

Figure 6:
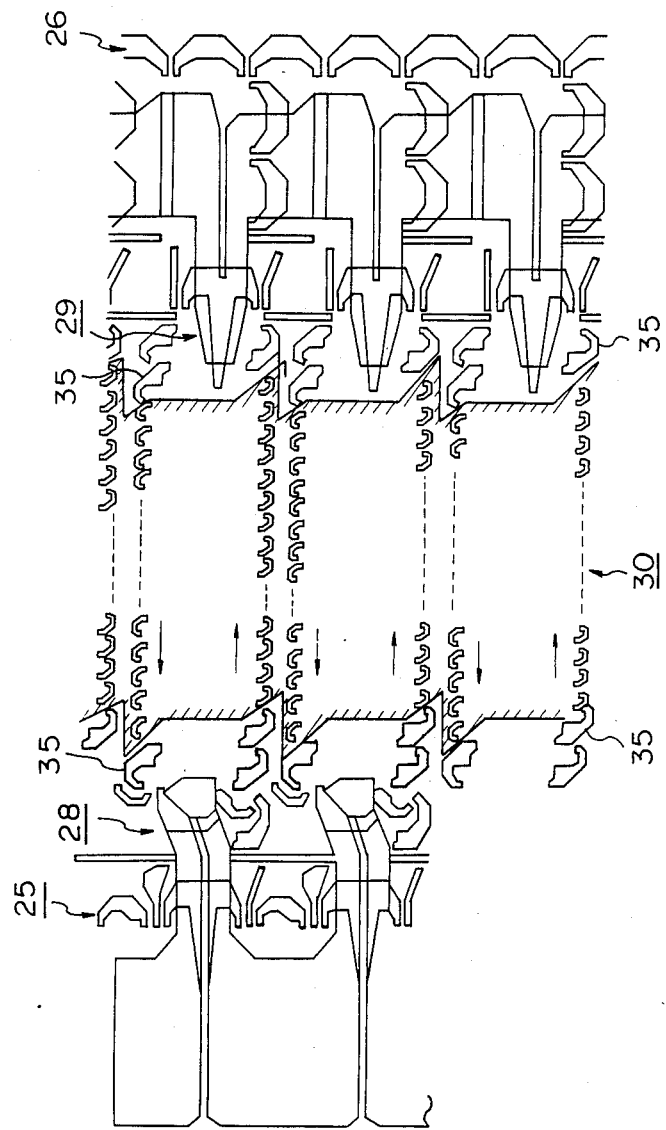
FIG. 6 is a plan view of a minor loop organization and areas adjacent to the gates thereof in the embodiment of FIG. 5; and, FIGS. 7 and 8 are plan views of the shapes of soft magnetic patterns used in the first and second areas, respectively, in the embodiment of FIG. 5.

FIG. 6 is a plan view of the minor-loop organization and the areas adjacent to the gates thereof, in which reference numeral 30 denotes a minor-loop organization; 25, recording major lines; 26, read out major lines; 28, swap-gates; and 29, replicate gates. In FIG. 6, the area illustrated by hatching in the minor loop organization 30 is the first area. On the other hand, the area of a few bits adjacent to the gates using large soft magnetic patterns 35 for connecting is included in the second area. Also, as will be understood from FIG. 6, the boundary portions between the first and second areas are defined by bubble transmission gaps between adjacent patterns of the respective areas.

Figure 7:
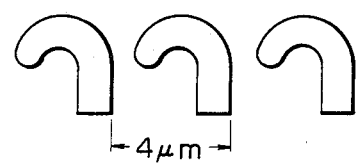
Figure 8:
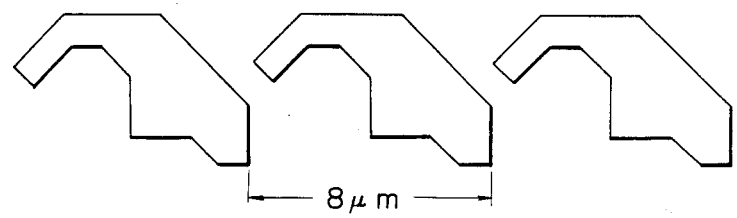

FIGS. 7 and 8 illustrate soft magnetic patterns used for the transmission lines in the minor loop organization 30 (FIG. 6) in the first area, and for the patterns 35 (FIG. 6) in the second area, respectively. The pattern illustrated in either FIGS. 7 or 8 is a so-called "Wide Gap" pattern, which has more advantages in size and in the possibility of high density loading than the half disk pattern or asymmetrical chevron pattern conventionally used in the prior art, since the gap spacing of the former is larger than that of the latter.

As discussed hereinbefore in detail, a method for manufacturing a magnetic bubble memory chip according to the present invention is particularly advantageously adopted when manufacturing a dual-spacing layer structure or dual spacing type bubble chip consisting of thin and thick layers. Consequently, according to the present invention, when the thin layer is formed, the unevenness of etching and variations in thickness thereof are prevented, so that magnetic bubble memory chips having stable bubble propagation performance and characteristics with less variations can be obtained.

I claim:

1. A process for manufacturing a magnetic bubble memory chip having a thin bubble film, on which a first area is provided with minor loop transmission lines for at least memorizing bubble information and a second area is provided with major transmission lines for recording or reading out the bubble information with respect to the minor loop transmission lines, said process comprising the steps of:

a first step for forming a first insulative layer on the thin bubble film over the first and second areas;

a second step for forming on said first insulative layer conductive patterns for controlling function gates;

a third step for coating a second insulative layer of resin over said first insulative layer and said conductive patterns for controlling function gates, and thermosetting the coated second insulative layer;

a fourth step for removing by etching parts of the first insulative layer and the second resin insulative layer, which exist on the first area;

a fifth step for forming a third insulative layer over the whole surface including the first and second areas; and, a sixth step for forming on the third insulative layer the minor loop transmission lines and the major transmission lines.

2. A process as set forth in claim 1, wherein a bubble transmission pattern in said minor loop transmission lines has a pattern period which is smaller than that of a bubble transmission pattern in said major transmission lines.

3. A process as set forth in claim 1, wherein said second insulative layer is $SiO_2$ and the thickness thereof is in the range from 1200 Å to 1500 Å.

4. A process as set forth in claim 3, wherein the thickness of the $SiO_2$ layer is about 1300 Å.

5. A process as set forth in claim 1, wherein the bubble transmission patterns in the first and second areas are formed with soft magnetic patterns, and the soft magnetic pattern in the first area has a pattern period of 4 μm to 6 μm and the soft magnetic pattern in the second area has a pattern period of not less than 8 μm.

6. A method as set forth in claim 1, wherein said first area includes a boot loop for memorizing information about faulty loops in the minor loop transmission lines.

7. A method as set forth in claim 5, wherein the soft magnetic patterns in at least the first area are wide gap patterns.

* * * * *